US012087600B2

(12) United States Patent
Matsushita (10) Patent No.: US 12,087,600 B2
(45) Date of Patent: Sep. 10, 2024

(54) THERMOCOUPLE GUIDE AND CERAMIC HEATER

(71) Applicant: NGK INSULATORS, LTD., Nagoya (JP)

(72) Inventor: Ryohei Matsushita, Yokkaichi (JP)

(73) Assignee: NGK INSULATORS, LTD., Nagoya (JP)

(*) Notice: Subject to any disclaimer, the term of this patent is extended or adjusted under 35 U.S.C. 154(b) by 299 days.

(21) Appl. No.: 17/303,548

(22) Filed: Jun. 2, 2021

(65) Prior Publication Data

US 2021/0391194 A1    Dec. 16, 2021

(30) Foreign Application Priority Data

Jun. 12, 2020 (JP) ................... 2020-102175

(51) Int. Cl.
*H01L 21/67* (2006.01)
*G01K 1/143* (2021.01)
*H05B 3/14* (2006.01)
*G01K 7/02* (2021.01)

(52) U.S. Cl.
CPC ........ *H01L 21/67103* (2013.01); *G01K 1/143* (2013.01); *H05B 3/143* (2013.01); *G01K 7/02* (2013.01)

(58) Field of Classification Search
CPC ............ G01K 1/14; G01K 1/143; G01K 7/02; G01K 7/04; H05B 1/0233; H05B 2203/003; H05B 2203/005; H05B 2203/016; H05B 3/02; H05B 3/143; H05B 3/22; H05B 3/283; H05B 3/74; H01L 21/67103; H01L 21/67248

USPC ....................................... 219/444.1
See application file for complete search history.

(56) References Cited

U.S. PATENT DOCUMENTS

2010/0284438 A1    11/2010    Aggarwal et al.
2012/0211933 A1     8/2012    Goto
2018/0076067 A1*    3/2018    Kitabayashi ...... H01L 21/68785

FOREIGN PATENT DOCUMENTS

CN       102598212 A     7/2012
TW       201222696 A1    6/2012
WO       2012/039453 A1  3/2012
WO       2013/162000 A1  10/2013

OTHER PUBLICATIONS

Taiwanese Office Action dated Jun. 6, 2022 (Application No. 110120594).
Chinese Office Action (with English translation) dated Dec. 28, 2023 (Application No. 202110656013.4).

* cited by examiner

*Primary Examiner* — Sang Y Paik
(74) *Attorney, Agent, or Firm* — BURR PATENT LAW, PLLC (57) ABSTRACT

A thermocouple guide includes a straight tube portion and a curved tube portion formed in continuation with the straight tube portion to turn an extension direction from the straight tube portion. A cross-section of a tip-side part of the curved tube portion, the tip-side part occupying a predetermined range including a tip end of the curved tube portion, has an external shape that is obtained by linearly cutting both sides of a circle.

5 Claims, 8 Drawing Sheets

Related Art

THERMOCOUPLE GUIDE AND CERAMIC HEATER

BACKGROUND OF THE INVENTION

1. Field of the Invention

The present invention relates to a thermocouple guide and a ceramic heater.

2. Description of the Related Art

Figure 11:
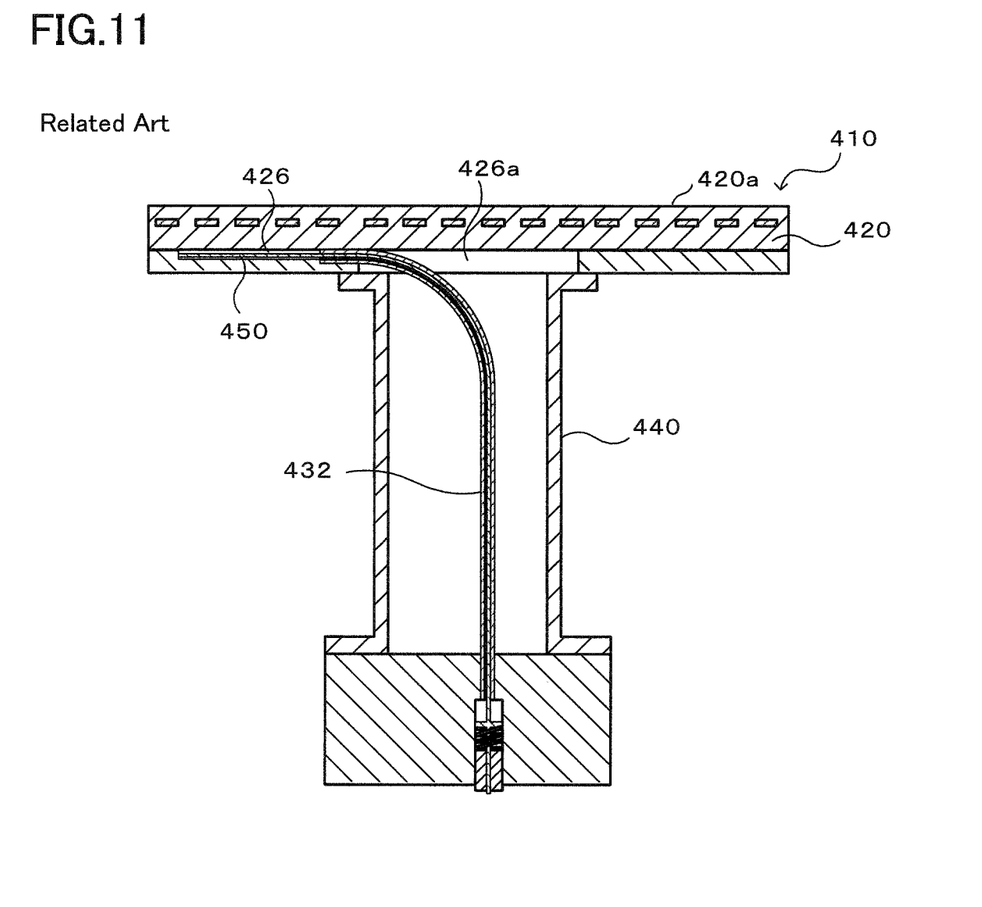
FIG. 11 is a sectional view of a ceramic heater 410.

As an example of ceramic heaters, the so-called 2-zone heater has hitherto been known in which resistance heating elements are independently embedded in an inner peripheral side and an outer peripheral side of a disk-shaped ceramic plate having a wafer placement surface. For example, Patent Literature (PTL) 1 discloses a shaft-equipped ceramic heater 410 illustrated in FIG. 11. In the disclosed shaft-equipped ceramic heater 410, a temperature on an outer peripheral side of a ceramic plate 420 is measured by an outer-peripheral-side thermocouple 450. A thermocouple guide 432 in the form of a tubular member extends straight through the inside of a straight shaft 440 upward from below and is then bent in a circular arc shape to turn 90°. The thermocouple guide 432 is attached to a slit 426a formed in a region of a rear surface of the ceramic plate 420, the region being surrounded by the straight shaft 440 when viewed from below. The slit 426a defines an inlet portion of a thermocouple passage 426. The outer-peripheral-side thermocouple 450 is inserted through a tube of the thermocouple guide 432 and extends up to an end position of the thermocouple passage 426.

CITATION LIST

Patent Literature

PTL 1: WO 2012/039453 A1 (FIG. 11)

SUMMARY OF THE INVENTION

In the ceramic heater 410, however, a slit 426a with a width greater than or equal to an outer diameter of the thermocouple guide 432 has to be formed in the ceramic plate in order to attach the thermocouple guide 432. Accordingly, a reduction of the slit width has been demanded.

The present invention has been made with intent to solve the above-described problem, and a main object of the present invention is to reduce a width of an inlet portion of a thermocouple passage.

The present invention provides a thermocouple guide including:

a straight tube portion; and a curved tube portion formed in continuation with the straight tube portion to turn an extension direction from the straight tube portion, wherein a cross-section of a tip-side part of the curved tube portion, the tip-side part occupying a predetermined range including a tip end of the curved tube portion, has an external shape that is obtained by linearly cutting both sides of a circle.

The above-described thermocouple guide is used as follows. The tip-side part of the thermocouple guide is arranged in an inlet portion of a thermocouple passage formed in a plate in which a resistance heating element is incorporated. A thin and long thermocouple is passed through the straight tube portion and the curved tube portion. Then, the thermocouple is guided into the thermocouple passage. In the thermocouple guide, the cross-section of the tip-side part of the curved tube portion, the tip-side part occupying the predetermined range including the tip end of the curved tube portion, has the external shape that is obtained by linearly cutting both sides of a circle. In other words, the tip-side part of the thermocouple guide is thinner than the straight tube portion. Therefore, a width of the inlet portion of the thermocouple passage can be reduced.

In the thermocouple guide according to the present invention, the external shape of the cross-section of the tip-side part may be a shape that is obtained by cutting both sides of a circle along two parallel chords having the same length. With this feature, in the tip-side part, wall thicknesses of the thermocouple guide can be set to be equal on both the sides of a guide hole.

In the thermocouple guide according to the present invention, the thermocouple guide may be a seamless tube. With this feature, there is no necessity of welding a plurality of tubes.

In the thermocouple guide according to the present invention, a guide hole in a base-side part of the straight tube portion, the base-side part occupying a predetermined range including a base end, may have a reverse-tapered surface gradually expanding toward the base end. With this feature, it is easier to insert a thermocouple into the thermocouple guide.

In the thermocouple guide according to the present invention, a curvature radius of the curved tube portion may be 15 mm or more and 50 mm or less, a stroke length of the curved tube portion may be 15 mm or more and 50 mm or less, and an angle through which the extension direction from the straight tube portion is turned by the curved tube portion may be 50° or more and 90° or less.

The present invention further provides a ceramic heater including:

a ceramic plate formed in a disk-like shape and having a wafer placement surface;

a tubular shaft bonded to a rear surface of the ceramic plate on an opposite side to the wafer placement surface;

an inner-peripheral-side resistance heating element embedded in an inner peripheral zone of the ceramic plate;

an outer-peripheral-side resistance heating element embedded in an outer peripheral zone of the ceramic plate;

associated components including a pair of terminals of the inner-peripheral-side resistance heating element and a pair of terminals of the outer-peripheral-side resistance heating element;

an elongate hole extending from a start point in a region of the rear surface of the ceramic plate, the region being positioned within the tubular shaft when viewed from below, to an end position in an outer peripheral portion of the ceramic plate;

an elongate groove defining an inlet portion of the elongate hole; and any one of the above-described thermocouple guides according to the present invention with the tip-side part of the curved tube portion being arranged in the elongate groove.

In the ceramic heater according to the present invention, the tip-side part of the thermocouple guide is thinner than the straight tube portion. Therefore, a width of the elongate groove can be reduced.

In the ceramic heater according to the present invention, a length of the elongate groove may be set to be longer than or equal to a length of the tip-side part of the curved tube portion. With this feature, the thermocouple guide can be easily arranged in the elongate groove.

In the ceramic heater according to the present invention, the tip-side part of the curved tube portion may be fitted into the elongate groove. With this feature, a width of the elongate groove can be reduced to be almost the same as that of the tip-side part.

The ceramic heater according to the present invention may further include a thermocouple inserted through both the thermocouple guide and the elongate hole.

DETAILED DESCRIPTION OF THE INVENTION

Figure 1:
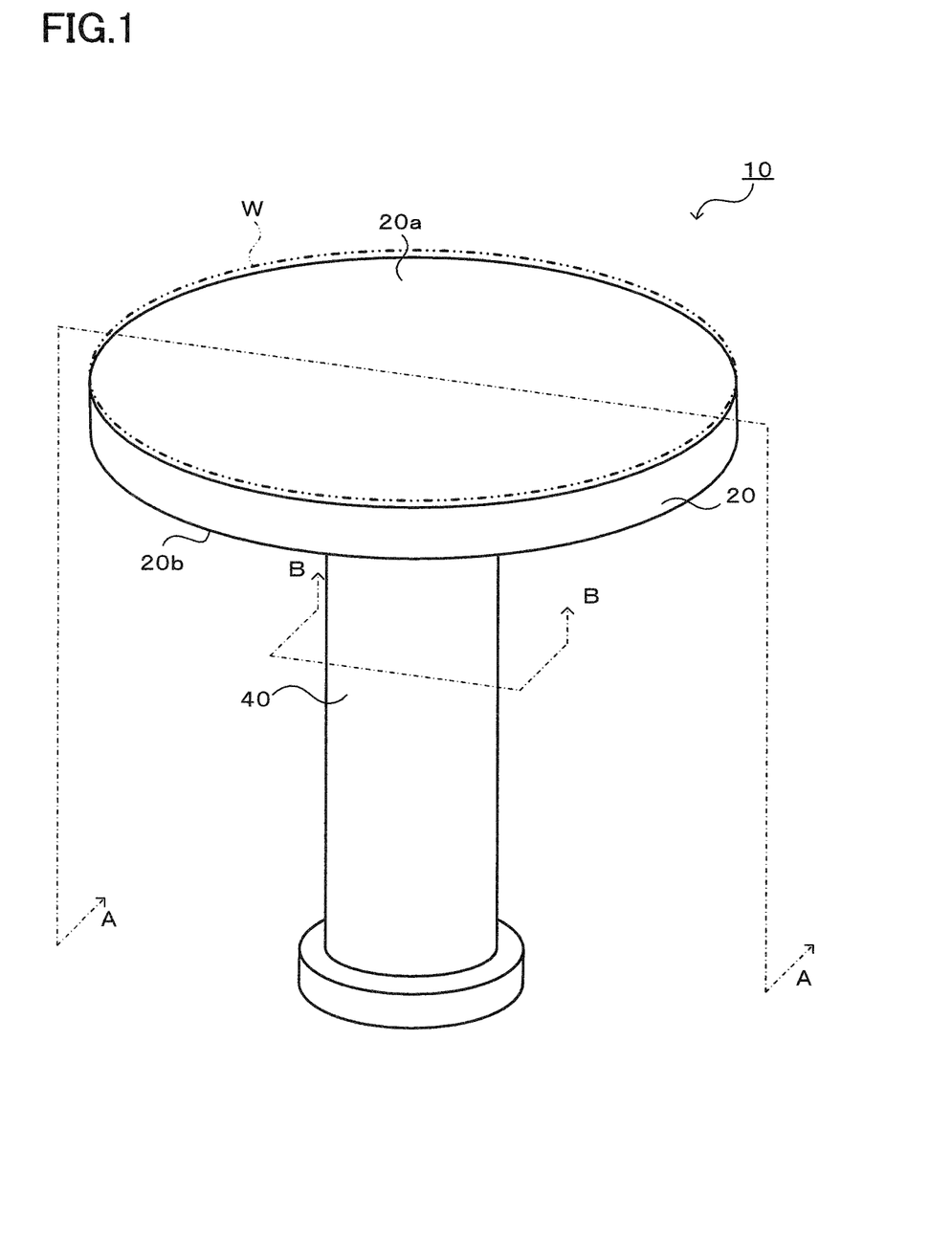
FIG. 1 is a perspective view of a ceramic heater 10.
Figure 2:
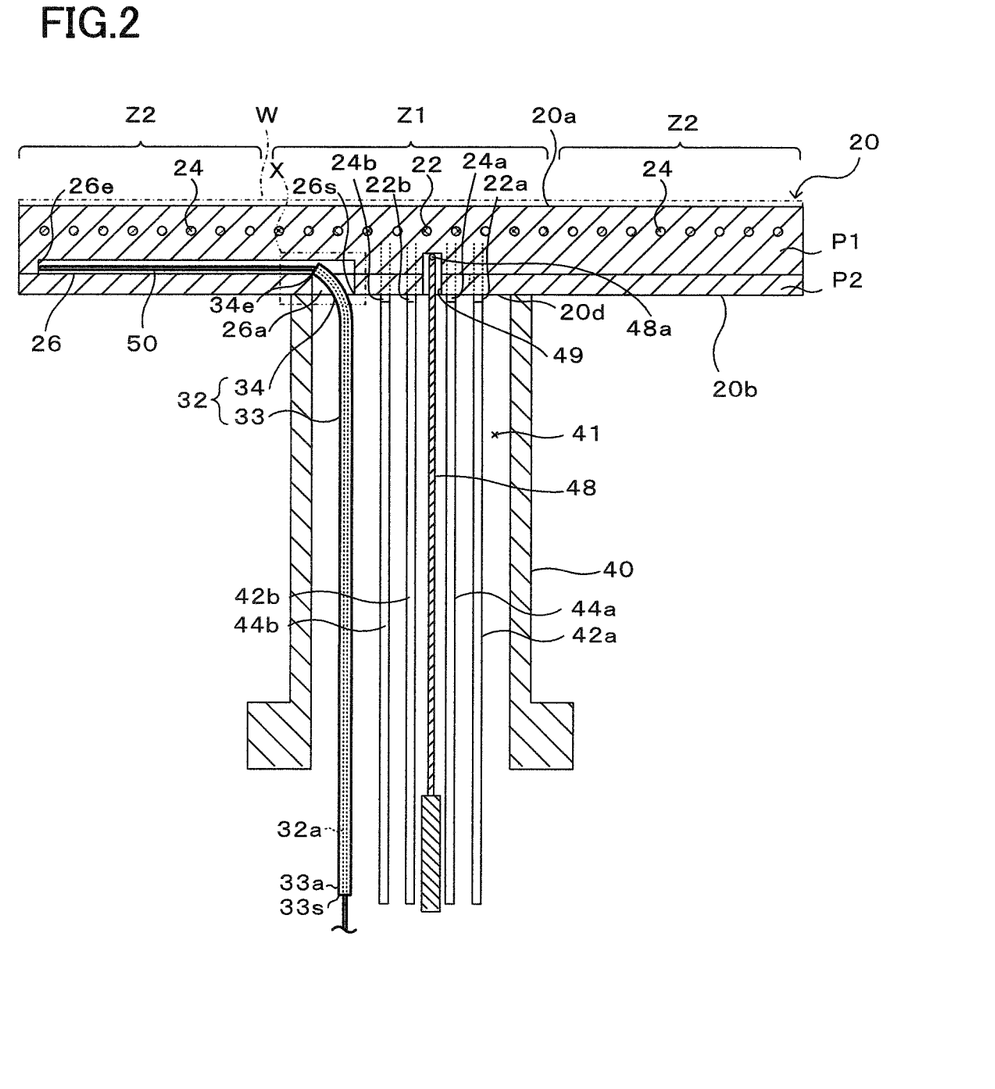
FIG. 2 is a sectional view taken along A-A in FIG. 1.
Figure 3:
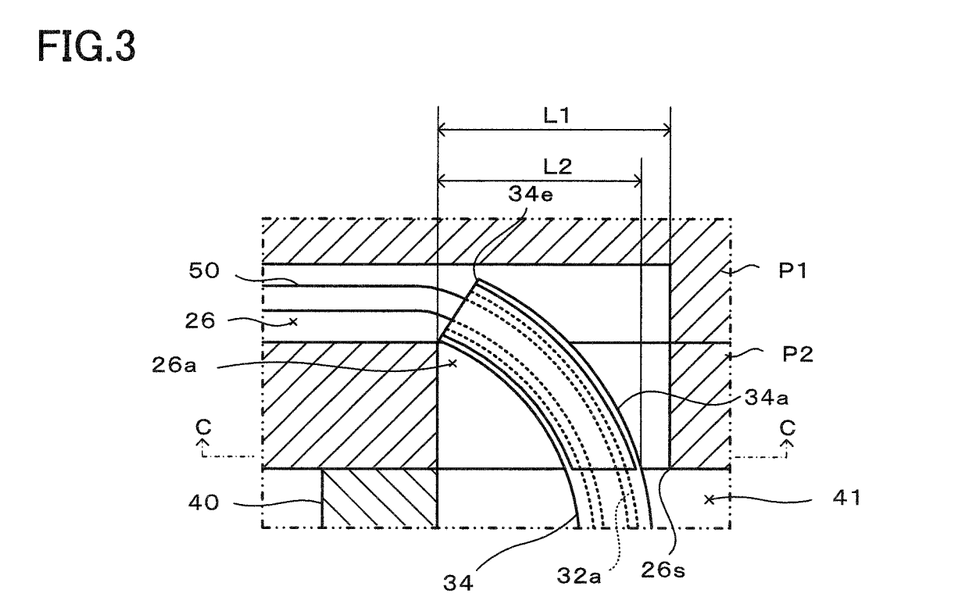
FIG. 3 is an enlarged view of a portion X in FIG. 2.
Figure 4:
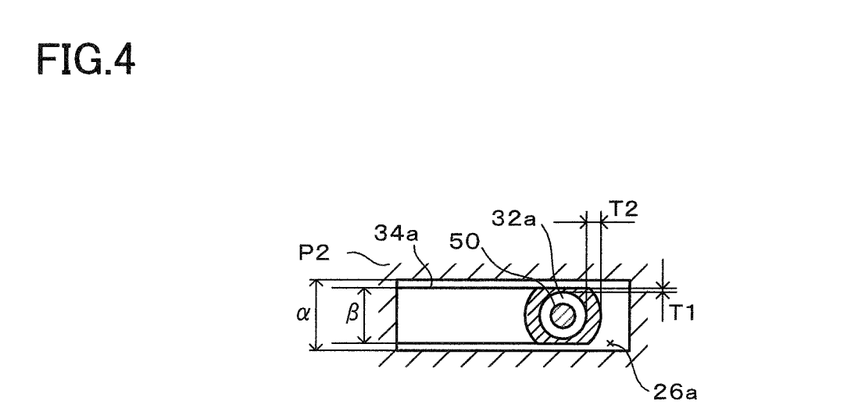
FIG. 4 is a sectional view taken along C-C in FIG. 3.
Figure 5:
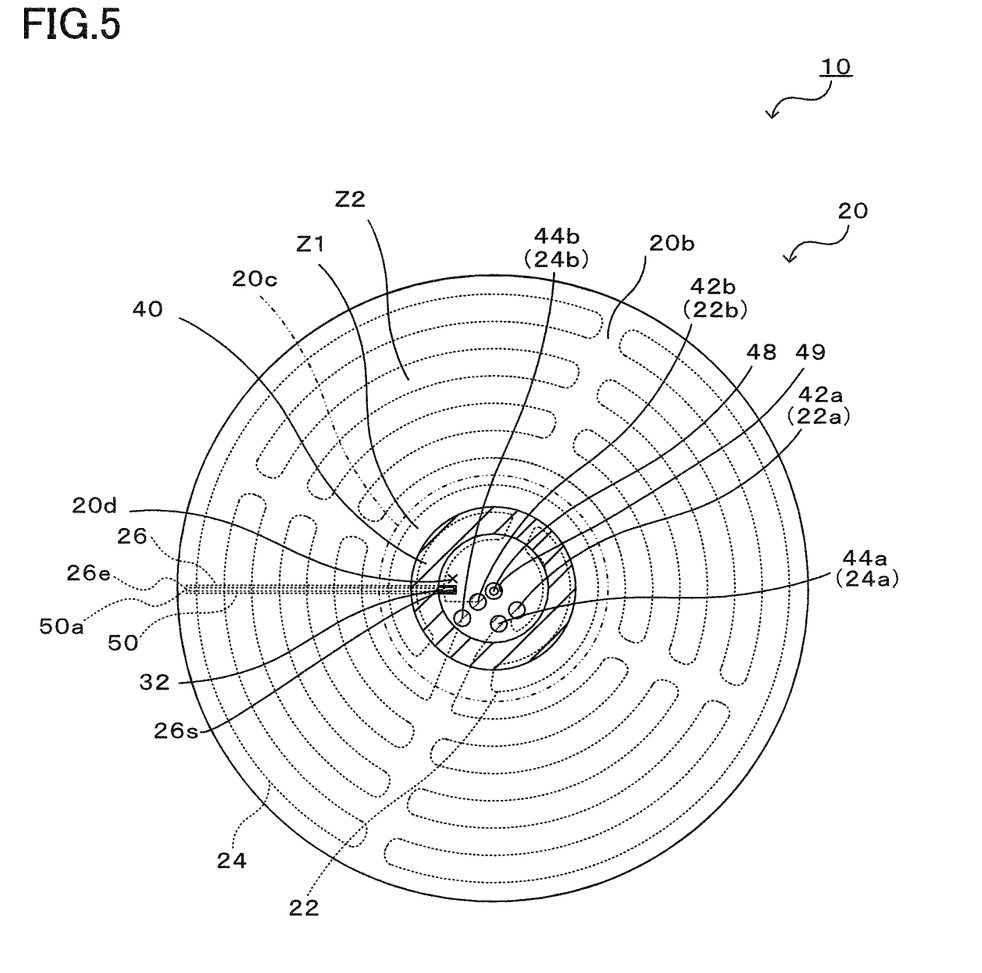
FIG. 5 is a sectional view taken along B-B in FIG. 1.
Figure 6:
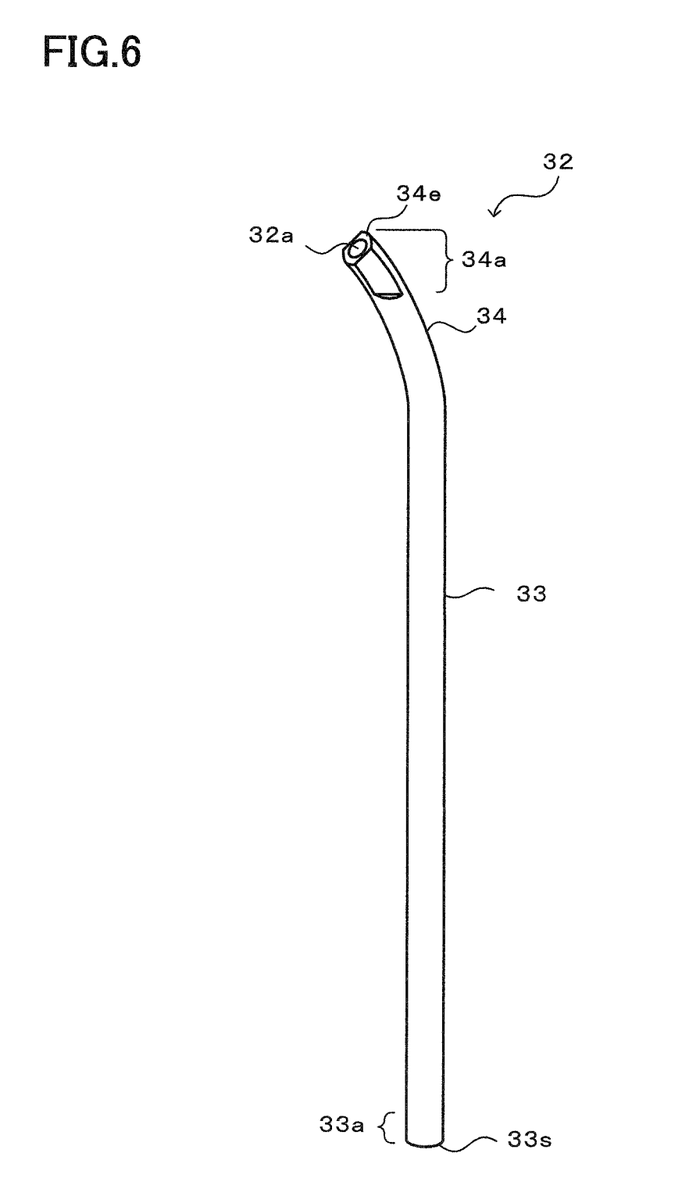
FIG. 6 is a perspective view of a thermocouple guide 32.
Figure 7:
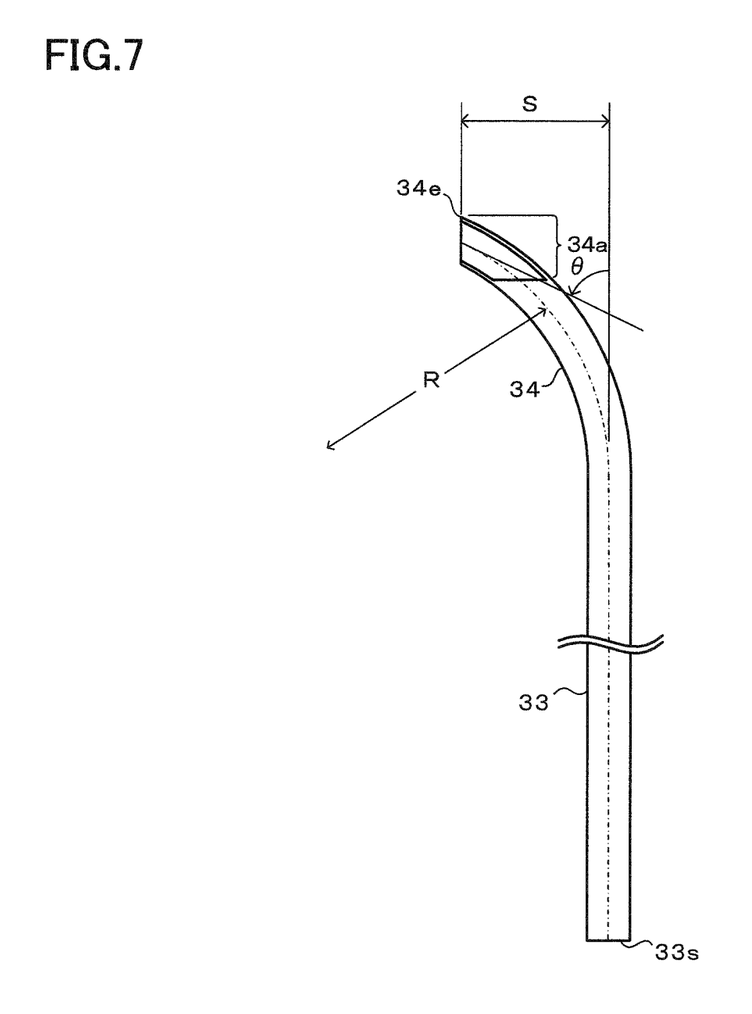
FIG. 7 is a front view of the thermocouple guide 32.
Figure 8:
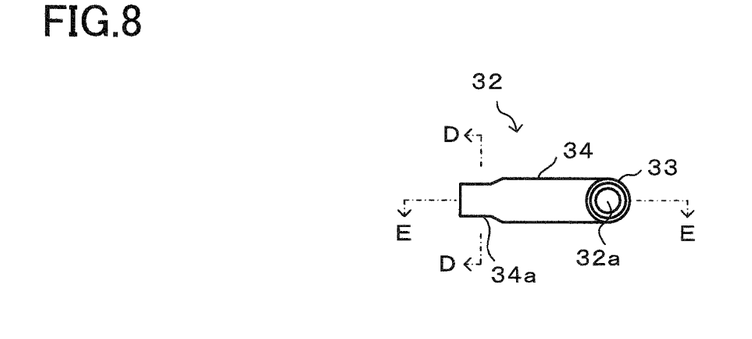
FIG. 8 is a bottom view of the thermocouple guide 32.
Figure 9:
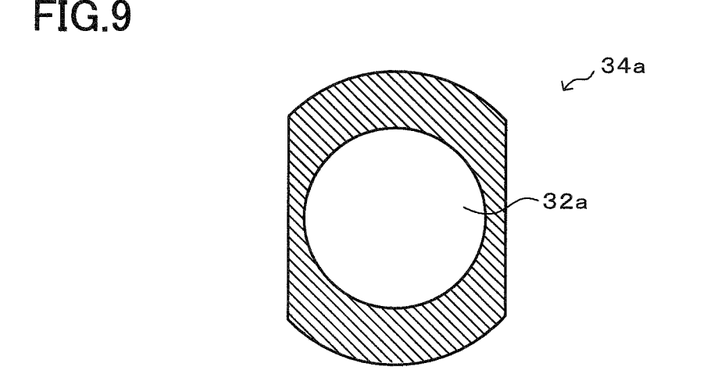
FIG. 9 is an enlarged sectional view taken along D-D in FIG. 8.
Figure 10:
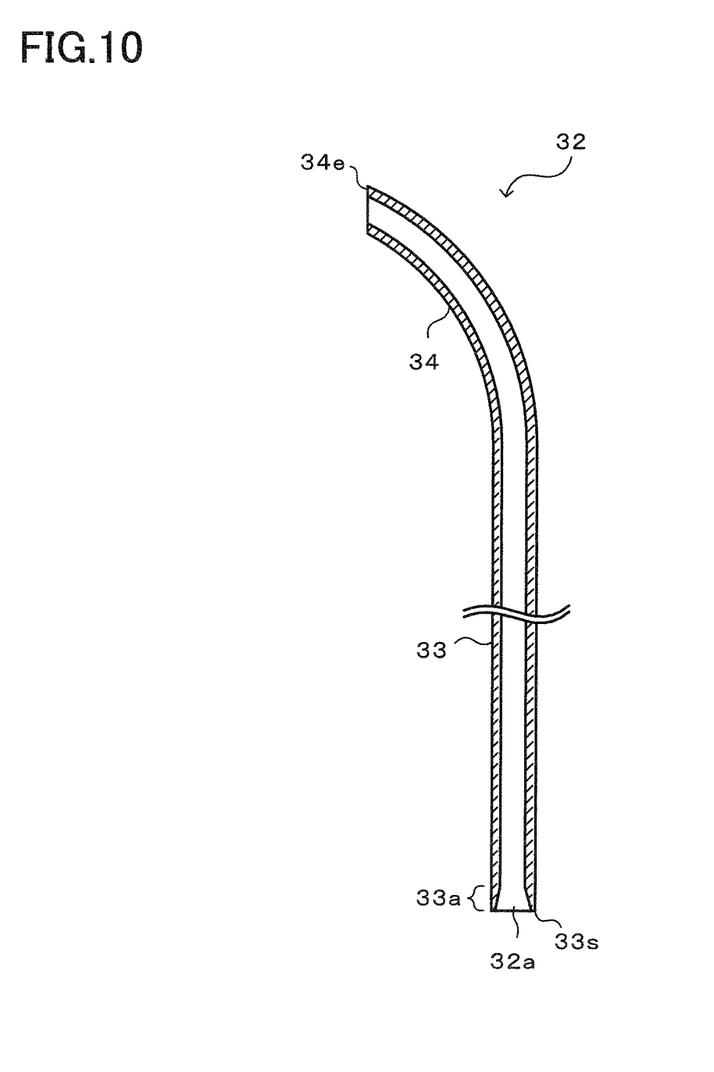
FIG. 10 is a sectional view taken along E-E in FIG. 8.

A preferred embodiment of the present invention will be described below with reference to the drawings. FIG. 1 is a perspective view of a ceramic heater 10, FIG. 2 is a sectional view taken along A-A in FIG. 1, FIG. 3 is an enlarged view of a portion X in FIG. 2, FIG. 4 is a sectional view taken along C-C in FIG. 3, FIG. 5 is a sectional view taken along B-B in FIG. 1, FIG. 6 is a perspective view of a thermocouple guide 32, FIG. 7 is a front view of the thermocouple guide 32, FIG. 8 is a bottom view of the thermocouple guide 32, FIG. 9 is an enlarged sectional view taken along D-D in FIG. 8, and FIG. 10 is a sectional view taken along E-E in FIG. 8.

The ceramic heater 10 is used to heat a wafer W on which processing, such as etching or CVD, is to be performed, and is installed inside a vacuum chamber (not illustrated). The ceramic heater 10 includes a disk-shaped ceramic plate 20 having a wafer placement surface 20a, and a tubular shaft 40 bonded to a surface (rear surface) 20b of the ceramic plate 20 on an opposite side to the wafer placement surface 20a.

The ceramic plate 20 is a disk-shaped plate made of a ceramic material represented by, for example, aluminum nitride or alumina. A diameter of the ceramic plate 20 is not limited to a particular value and is 200-400 mm (for example, about 300 mm). The ceramic plate 20 is divided into an inner peripheral zone Z1 of a small circular shape and an outer peripheral zone Z2 of an annular shape by an imaginary boundary 20c (see FIG. 4) that is concentric to the ceramic plate 20. An inner-peripheral-side resistance heating element 22 is embedded in the inner peripheral zone Z1 of the ceramic plate 20, and an outer-peripheral-side resistance heating element 24 is embedded in the outer peripheral zone Z2. The resistance heating elements 22 and 24 are each constituted by a coil containing, for example, molybdenum, tungsten, or tungsten carbide as a main component. As illustrated in FIG. 2, the ceramic plate 20 is fabricated by face-to-face bonding of an upper plate P1 and a lower plate P2 thinner than the upper plate P1.

The tubular shaft 40 is made of ceramic, for example, aluminum nitride or alumina, as in the ceramic plate 20. The tubular shaft 40 is diffusion-bonded at its upper end to the ceramic plate 20.

As illustrated in FIG. 5, the inner-peripheral-side resistance heating element 22 is formed such that it starts from one of a pair of terminals 22a and 22b and reaches the other of the pair of terminals 22a and 22b after being wired in a one-stroke pattern substantially over the entirety of the inner peripheral zone Z1 while being folded at a plurality of turn-around points. The pair of terminals 22a and 22b are disposed in a within-shaft region 20d (namely, a region of the rear surface 20b of the ceramic plate 20, the region being positioned within the tubular shaft 40 when viewed from below). Power feeder rods 42a and 42b made of metal (for example, Ni) are bonded to the pair of terminals 22a and 22b, respectively.

As illustrated in FIG. 5, the outer-peripheral-side resistance heating element 24 is formed such that it starts from one of a pair of terminals 24a and 24b and reaches the other of the pair of terminals 24a and 24b after being wired in a one-stroke pattern substantially over the entirety of the outer peripheral zone Z2 while being folded at a plurality of turn-around points. The pair of terminals 24a and 24b are disposed in the within-shaft region 20d of the rear surface 20b of the ceramic plate 20. Power feeder rods 44a and 44b made of metal (for example, Ni) are bonded to the pair of terminals 24a and 24b, respectively.

Inside the ceramic plate 20, as illustrated in FIG. 2, an elongate hole 26 through which an outer-peripheral-side thermocouple 50 is to be inserted is formed parallel to the wafer placement surface 20a. The elongate hole 26 extends from a start point 26s in the within-shaft region 20d of the rear surface 20b of the ceramic plate 20 to a predetermined end position 26e in an outer peripheral portion of the ceramic plate 20. As illustrated in FIGS. 3 and 4, a portion of the elongate hole 26 ranging from the start point 26s to a boundary with respect to the tubular shaft 40 is formed as an elongate groove 26a into which a tip-side part 34a of the thermocouple guide 32 is to be fitted. The elongate groove 26a is opened to an inner space 41 of the tubular shaft 40. The terminals 22a, 22b, 24a and 24b are disposed at positions in the within-shaft region 20d except for the elongate groove 26a.

The thermocouple guide 32 is obtained by bending one seamless tube made of metal (for example, stainless). As illustrated in FIGS. 6 to 8, the thermocouple guide 32 includes a straight tube portion 33, a curved tube portion 34, and a guide hole 32a. The straight tube portion 33 is, as illustrated in FIG. 7, a vertically extending portion. The curved tube portion 34 is, as illustrated in FIG. 7, a circular-arc portion that turns a tip end 34e through an angle θ relative to the straight tube portion 33. The angle θ is an angle formed between a tangent line at a tip end of a center axis of the curved tube portion 34 and a center axis of the straight tube portion 33. As illustrated in FIG. 3, a region of the curved tube portion 34 extending from the tip end 34e over a predetermined range covering at least a section that is fitted into the elongate groove 26a is called the tip-side part 34a. The tip end 34e of the thermocouple guide 32 may be simply fitted into the elongate groove 26a or may be fixedly bonded or stuck in the elongate groove 26a. As illustrated in FIG. 9, a cross-section of the tip-side part 34a has an external shape that is obtained by linearly cutting both sides of a circle, more specifically, that is obtained by cutting both sides of a circle along two parallel chords having the same length. The guide hole 32a is a hole for guiding the outer-peripheral-side thermocouple 50 up to the elongate hole 26. In a base-side part 33*a* of the straight tube portion 33, the base-side part 33*a* occupying a predetermined range including a base end 33*s*, the guide hole 32*a* has a reverse-tapered surface gradually expanding toward the base end 33*s* as illustrated in FIG. 10.

An outer diameter of the thermocouple guide 32 in a region except for the tip-side part 34*a* of which cross-section has the external shape obtained by linearly cutting both sides of a circle is preferably 4.9 mm or more and 5.1 mm or less, and an inner diameter of the thermocouple guide 32 (namely, a diameter of the guide hole 32*a* except for the base-side part 33*a*) is preferably 2.9 mm or more and 3.1 mm or less. A curvature radius R and a stroke length S (horizontal distance from the tip end 34*e* of the curved tube portion 34 to the center axis of the straight tube portion 33) of the curved tube portion 34 and the angle θ are preferably set in consideration of a percentage of the thermocouple guide 32 occupying the inner space 41 when the thermocouple guide 32 is attached to the ceramic heater 10. For example, the curvature radius R is preferably 15 mm or more and 50 mm or less, more preferably 20 mm or more and 50 mm or less and further more preferably 20 mm or more and 30 mm or less. The stroke length S is preferably 15 mm or more and 50 mm or less and more preferably 20 mm or more and 30 mm or less. The angle θ is preferably 50° or more and 90° or less.

A wall thickness T2 (see FIG. 4) of the thermocouple guide 32 in a region except for the tip-side part 34*a* and the base-side part 33*a* is preferably 0.9 mm or more and 1.1 mm or less. A width β (see FIG. 4) between opposing planes in the cross-section of the tip-side part 34*a* is preferably set in consideration of that a width α (see FIG. 4) of the elongate groove 26*a* is to be reduced. A wall thickness T1 (see FIG. 4) of the tip-side part 34*a* in a region where its wall thickness is thinnest is preferably set such that the tip-side part 34*a* has rigidity and strength at a level not causing damage in the above-mentioned region. For example, the width β is preferably 3.5 mm or more and 3.7 mm or less, and the wall thickness T1 is preferably 0.2 mm or more and 0.4 mm or less. The tip-side part 34*a* is fitted into the elongate groove 26*a* as illustrated in FIGS. 3 and 4. A horizontal length L1 of the elongate groove 26*a* is preferably set, as illustrated in FIG. 3, to be longer than or equal to a horizontal length L2 of the tip-side part 34*a*. The width α of the elongate groove 26*a* is preferably set, as illustrated in FIG. 4, to be almost the same as the width β of the tip-side part 34*a* on condition that the tip-side part 34*a* can be fitted into the elongate groove 26*a*.

As illustrated in FIG. 2, the power feeder rods 42*a* and 42*b* connected respectively to the pair of terminals 22*a* and 22*b* of the inner-peripheral-side resistance heating element 22 and the power feeder rods 44*a* and 44*b* connected respectively to the pair of terminals 24*a* and 24*b* of the outer-peripheral-side resistance heating element 24 are arranged inside the tubular shaft 40. In addition, an inner-peripheral-side thermocouple 48 for measuring a temperature near a center of the ceramic plate 20 and the outer-peripheral-side thermocouple 50 for measuring a temperature near an outer periphery of the ceramic plate 20 are also arranged inside the tubular shaft 40. The inner-peripheral-side thermocouple 48 is inserted into a recess 49 formed in the rear surface 20*b* of the ceramic plate 20, and a temperature measuring portion 48*a* at a tip end of the inner-peripheral-side thermocouple 48 is held in contact with the ceramic plate 20. The recess 49 is formed at a position not interfering with the terminals 22*a*, 22*b*, 24*a* and 24*b* and the elongate groove 26*a*. The outer-peripheral-side thermocouple 50 is a sheath thermocouple and is arranged such that, after passing through the guide hole 32*a* of the thermocouple guide 32 and the elongate hole 26, a temperature measuring portion 50*a* at a tip end reaches the end position 26*e* of the elongate hole 26.

An example of manufacturing of the ceramic heater 10 will be described below. The thermocouple guide 32 is attached in a last stage of a manufacturing process for the ceramic heater 10. The tubular shaft 40 is bonded to the rear surface 20*b* of the ceramic plate 20, and the power feeder rods 42*a*, 42*b*, 44*a* and 44*b* are bonded respectively to the terminals 22*a*, 22*b*, 24*a* and 24*b* that are exposed at the rear surface 20*b* of the ceramic plate 20. Thereafter, the thermocouple guide 32 is attached. More specifically, the tip-side part 34*a* of the thermocouple guide 32 is fitted into the elongate groove 26*a*. Then, the outer-peripheral-side thermocouple 50 is inserted through the guide hole 32*a* of the thermocouple guide 32 until the temperature measuring portion 50*a* reaches the end position 26*e* of the elongate hole 26.

An example of use of the ceramic heater 10 will be described below. First, the ceramic heater 10 is installed inside the vacuum chamber (not illustrated), and the wafer W is placed on the wafer placement surface 20*a* of the ceramic heater 10. Then, electric power supplied to the inner-peripheral-side resistance heating element 22 is adjusted such that the temperature detected by the inner-peripheral-side thermocouple 48 becomes a predetermined inner-peripheral-side target temperature, and electric power supplied to the outer-peripheral-side resistance heating element 24 is adjusted such that the temperature detected by the outer-peripheral-side thermocouple 50 becomes a predetermined outer-peripheral-side target temperature. As a result, the temperature of the wafer W is controlled to be held at a desired temperature. Thereafter, the vacuum chamber is evacuated to be set to a vacuum atmosphere or a reduced pressure atmosphere, and plasma is generated in the vacuum chamber. By utilizing the generated plasma, CVD film formation or etching is performed on the wafer W.

In the above-described thermocouple guide 32 according to this embodiment, the cross-section of the tip-side part 34*a* of the curved tube portion 34, the tip-side part 34*a* occupying the predetermined range including the tip end 34*e* of the curved tube portion 34, has the external shape that is obtained by linearly cutting both sides of a circle. In other words, the tip-side part 34*a* of the thermocouple guide 32 is thinner than the straight tube portion 33. Therefore, the width α of the elongate groove 26*a* can be reduced.

In the above-described thermocouple guide 32 according to this embodiment, the external shape of the cross-section of the tip-side part 34*a* is the shape that is obtained by cutting both sides of a circle along two parallel chords having the same length. In the tip-side part 34*a*, therefore, wall thicknesses of the thermocouple guide 32 can be set to be equal on both the sides of the guide hole 32*a*.

In the above-described thermocouple guide 32 according to this embodiment, since the thermocouple guide 32 is a seamless tube, there is no necessity of welding a plurality of tubes.

In the above-described thermocouple guide 32 according to this embodiment, the guide hole 32*a* in the base-side part 33*a* of the straight tube portion 33, the base-side part 33*a* occupying the predetermined range including the base end 33*s*, has the reverse-tapered surface gradually expanding toward the base end 33*s*. It is, therefore, easier to insert the outer-peripheral-side thermocouple 50 into the thermocouple guide 32.

In the ceramic heater 10 according to this embodiment, the length of the elongate groove 26a is set to be longer than or equal to that of the tip-side part 34a of the curved tube portion 34. Therefore, the thermocouple guide 32 can be easily arranged in the elongate groove 26a.

Furthermore, the tip-side part 34a of the curved tube portion 34 is fitted into the elongate groove 26a. Therefore, the width α of the elongate groove 26a can be reduced to be almost the same as the width β of the tip-side part 34a.

It is needless to say that the present invention is not limited to the above-described embodiment, and that the present invention can be put into practice in various forms insofar as falling within the technical scope of the present invention.

For example, while, in the above-described embodiment, each of the resistance heating elements 22 and 24 has the shape of a coil, the shape of the resistance heating element is not limited to a coil for any special reason. The resistance heating element may be, for example, a printed pattern, or may have a ribbon-like or mesh-like shape.

In the above-described embodiment, an electrostatic electrode or an RF electrode may be incorporated in the ceramic plate 20 in addition to the resistance heating elements 22 and 24.

In the above-described embodiment, one or more annular regions may be set between the inner-peripheral-side resistance heating element 22 and the outer-peripheral-side resistance heating element 24, and an additional resistance heating element may be arranged for each of the annular regions.

While, in the above-described embodiment, the length of the thermocouple guide 32 in an up-down direction is set to be substantially the same as the height of the tubular shaft 40, the length of the thermocouple guide 32 may be shorter than or longer than the height of the tubular shaft 40.

In the above-described embodiment, the inner peripheral zone Z1 may be divided into a plurality of inner peripheral small zones, and the resistance heating element may be wired in a one-stroke pattern for each of the inner peripheral small zones. Furthermore, the outer peripheral zone Z2 may be divided into a plurality of outer peripheral small zones, and the resistance heating element may be wired in a one-stroke pattern for each of the outer peripheral small zones. In such a case, the number of the terminals increases corresponding to the number of the divided small zones. However, since those terminals do not interfere with the thermocouple guide 32, the terminals can be relatively easily arranged near a center of the within-shaft region 20d in spite of an increase in the number of the terminals.

In accordance with the procedures described, by way of example, in the above embodiment, the thermocouple guide 32 is attached after bonding the tubular shaft 40 to the rear surface 20b of the ceramic plate 20 and further bonding the power feeder rods 42a, 42b, 44a and 44b respectively to the terminals 22a, 22b, 24a and 24b in the ceramic plate 20. However, the procedures for attaching the thermocouple guide 32 are not limited to that case. In another example, after bonding the tubular shaft 40 to the rear surface 20b of the ceramic plate 20 and attaching the thermocouple guide 32, the power feeder rods 42a, 42b, 44a and 44b may be bonded respectively to the terminals 22a, 22b, 24a and 24b. In still another example, the thermocouple guide 32 may be attached to the elongate groove 26a in advance, and the tubular shaft 40 may be bonded to the rear surface 20b of the ceramic plate 20 after bonding the power feeder rods 42a, 42b, 44a and 44b to the terminals 22a, 22b, 24a and 24b, respectively.

This application claims priority based on Japanese Patent Application No. 2020-102175 filed on Jun. 12, 2020, the entire contents of which are incorporated herein by reference.

What is claimed is:

1. A ceramic heater comprising:
a ceramic plate formed in a disk-like shape and having a wafer placement surface;
a tubular shaft bonded to a rear surface of the ceramic plate on an opposite side to the wafer placement surface;
an inner-peripheral-side resistance heating element embedded in an inner peripheral zone of the ceramic plate;
an outer-peripheral-side resistance heating element embedded in an outer peripheral zone of the ceramic plate;
associated components including a pair of terminals of the inner-peripheral-side resistance heating element and a pair of terminals of the outer-peripheral-side resistance heating element;
an elongate hole extending from a start point in a region of the rear surface of the ceramic plate, the region being positioned within the tubular shaft when viewed from below, to an end position in an outer peripheral portion of the ceramic plate;
an elongate groove defining an inlet portion of the elongate hole; and
a thermocouple guide comprising a straight tube portion; and a curved tube portion formed in continuation with the straight tube portion to turn an extension direction from the straight tube portion, wherein a cross-section of a tip-side part of the curved tube portion, the tip-side part occupying a predetermined range including a tip end of the curved tube portion, has an external shape that is obtained by linearly cutting both sides of a circle with the tip-side part of the curved tube portion being arranged in the elongate groove, and
further comprising a thermocouple inserted through both the thermocouple guide and the elongate hole, and
wherein a horizontal length of the elongate groove is set to be equal to a length of the tip-side part of the curved tube portion, and
wherein a width of the elongate groove is substantially the same as the tip side part of the curved tube portion.

2. The ceramic heater according to claim 1, wherein the external shape of the cross-section of the tip-side part is a shape that is obtained by cutting both sides of a circle along two parallel chords having the same length.

3. The ceramic heater according to claim 1, wherein the thermocouple guide is a seamless tube.

4. The ceramic heater according to claim 1,
wherein a curvature radius of the curved tube portion is 15 mm or more and 50 mm or less,
a stroke length of the curved tube portion is 15 mm or more and 50 mm or less, and
an angle through which the extension direction from the straight tube portion is turned by the curved tube portion is 50° or more and 90° or less.

5. The ceramic heater according to claim 1, wherein the tip-side part of the curved tube portion is fitted into the elongate groove.

* * * * *